United States Patent
Sheats

(10) Patent No.: US 8,522,848 B2
(45) Date of Patent: Sep. 3, 2013

(54) METHODS AND APPARATUSES FOR ASSEMBLING COMPONENTS ONTO SUBSTRATES

(76) Inventor: Jayna Sheats, Palo Alto, CA (US)

( * ) Notice: Subject to any disclaimer, the term of this patent is extended or adjusted under 35 U.S.C. 154(b) by 922 days.

(21) Appl. No.: 12/418,611

(22) Filed: Apr. 6, 2009

(65) Prior Publication Data

US 2010/0252186 A1    Oct. 7, 2010

(51) Int. Cl.
- *B32B 38/14* (2006.01)
- *B32B 38/10* (2006.01)
- *B32B 38/18* (2006.01)
- *B30B 5/00* (2006.01)

(52) U.S. Cl.
USPC ..... 156/384; 156/387; 156/583.7; 219/444.1; 219/647

(58) Field of Classification Search
USPC .............. 156/583.7, 277, 240, 384, 387
See application file for complete search history.

(56) References Cited

U.S. PATENT DOCUMENTS

| | | | |
|---|---|---|---|
| 4,259,564 A * | 3/1981 | Ohkubo et al. | 347/208 |
| 5,994,174 A | 11/1999 | Carey et al. | |
| 6,049,064 A * | 4/2000 | Natsuhara et al. | 219/216 |
| 6,693,257 B1 * | 2/2004 | Tanaka | 219/121.76 |
| 6,946,178 B2 | 9/2005 | Sheats et al. | |
| 7,141,348 B2 | 11/2006 | Sheats et al. | |
| 7,799,699 B2 * | 9/2010 | Nuzzo et al. | 438/758 |
| 2003/0116559 A1 * | 6/2003 | Park | 219/543 |
| 2004/0149705 A1 * | 8/2004 | Yamada et al. | 219/121.69 |
| 2010/0255179 A1 * | 10/2010 | Knox et al. | 427/8 |

FOREIGN PATENT DOCUMENTS

| | | | |
|---|---|---|---|
| JP | 58153672 A * | 9/1983 | |
| JP | 61086270 A * | 5/1986 | |

* cited by examiner

*Primary Examiner* — Sonya Mazumdar
(74) *Attorney, Agent, or Firm* — Tue Nguyen

(57) ABSTRACT

The present invention relates to methods and apparatuses for assembling substrates with functional blocks, using a printhead to deliver individual functional blocks to the appropriate locations on the substrates. In an embodiment, the functional block releasing mechanism comprises a heat source to provide thermal energy and a light source to provide photon energy, wherein the heat source and the light source enable releasing individual functional blocks from the reservoir for positioning on the substrate. The heat source can comprise an array of heating elements, such as thin film heating elements, which can provide localized heating to individual elements, thus enabling releasing individual functional blocks. The light source can comprise a laser beam and a moving mechanism to move the laser beam to the individual functional blocks.

14 Claims, 2 Drawing Sheets

METHODS AND APPARATUSES FOR ASSEMBLING COMPONENTS ONTO SUBSTRATES

BACKGROUND

There is a need to distribute functional blocks such as integrated circuit chips across large area substrates, such as a roll-to-roll substrate or a plurality of panel substrates where the active circuitry such as the functional blocks only occupies a small fraction of the substrate. Thus it may be advantageous to process the functional blocks in a different substrate and then transfer the completed functional blocks to the final substrates. Prior arts include processes in which the functional blocks are deposited into a substrate using a pick-and-place or a fluidic-self assembly process.

An exemplary pick and place process uses a human or robot arm to pick each functional block and place it into its corresponding location in the assembly substrate. The pick and place process is usually serial, placing one functional block at a time, and is thus slow for numerous devices such as RFID devices or pixels of large arrays, and difficult for very small devices because the pick and place unit is hard to make in a small size.

The fluidic self assembly process employs fluid transport to assemble functional blocks on a substrate. The fluidic self assembly process mixes the functional blocks in a fluid and then dispenses the mixture over the surface of the receiving substrate where the functional blocks randomly align onto receptor regions.

SUMMARY

The present invention relates to methods and apparatuses for assembling substrates with functional blocks, using a printhead to deliver individual functional blocks to the appropriate locations on the substrates. The present method of delivering functional blocks can provide improved efficiency in substrate assembling, especially for small functional blocks.

In an embodiment, the functional blocks are transferred as a block to the printhead, for example, to a reservoir in the printhead. The printhead moves relative to the substrate, and individual functional blocks are then transferred to the appropriate locations on the substrate. Afterward, the printhead can move to a new position of the substrate, and/or the substrate can advance to a new position.

In an embodiment, the printhead has a reservoir for accepting the functional blocks, and a releasing mechanism to release individual functional blocks for positioning on a substrate. In an aspect, the reservoir has the functional blocks positioned in a plane, and thus the functional blocks can be transferred as a wafer, or part of a wafer, directly to the reservoir. The functional blocks can be diced portions of a processed wafer. The functional blocks can be stored in the printhead by a releasable adhesive. The releasing mechanism can comprise a heat source and/or a light source, and can release one or more functional blocks at one time.

In an embodiment, the releasing mechanism comprises a heat source to provide thermal energy and a light source to provide photon energy, wherein the heat source and the light source enable releasing individual functional blocks from the reservoir for positioning on the substrate. In an aspect, the functional blocks are adhered to the printhead reservoir through a releasable adhesive, which loses the adhesive property to release the functional blocks. With the substrate positioned in the vicinity, after the functional blocks are released from the printhead, the functional blocks are then delivered to the proper locations on the substrate. In an embodiment, the heat source comprises an array of heating elements, such as thin film heating elements. The heating element can be transparent to allow the transmission of light. In an aspect, the array of thin film heating elements can provide localized heating to individual elements, thus enabling releasing individual functional blocks. For example, a heating controller such as an addressable thin film transistor device can control the array of heating elements to enable heating of individual elements. In an embodiment, the light source comprises a laser beam and a moving mechanism to move the laser beam to the individual functional blocks to provide photon energy to the releasable adhesive. Additional optical components can be included, such as a mirror mechanism for splitting or moving the light source.

In an embodiment, the present invention discloses a system for assembling functional blocks on a substrate through a printhead with the printhead holding a plurality of functional blocks for delivering to the appropriate locations on the substrate. The system further comprises a moving mechanism to position the printhead with respect to the substrate where the printhead releases individual functional blocks on the substrate. The system can comprise a substrate moving mechanism to advance the substrate. In an aspect, the substrate is a roll-to-roll substrate advancing continuously, or a plurality of planar substrates, advancing one at a time. The system can further comprise a substrate loading station for loading the substrate, and/or a printhead loading station for loading the printhead with functional blocks.

In an embodiment, the present invention discloses a method for assembling functional blocks on a substrate through a printhead with the printhead holding a plurality of functional blocks. After positioning the printhead at a desired location on a substrate, a heat source and a light source are supplied to at least one functional block in the printhead to release to functional block onto the substrate. In an aspect, the method further comprises loading the printhead with a plurality of functional blocks before moving the printhead to the substrate assembly system. The heat source can be applied before or after the light source for releasing the functional blocks. The heat source can be applied to individual functional blocks to improve efficiency.

DETAILED DESCRIPTION OF THE PREFERRED EMBODIMENTS

Figure 1:
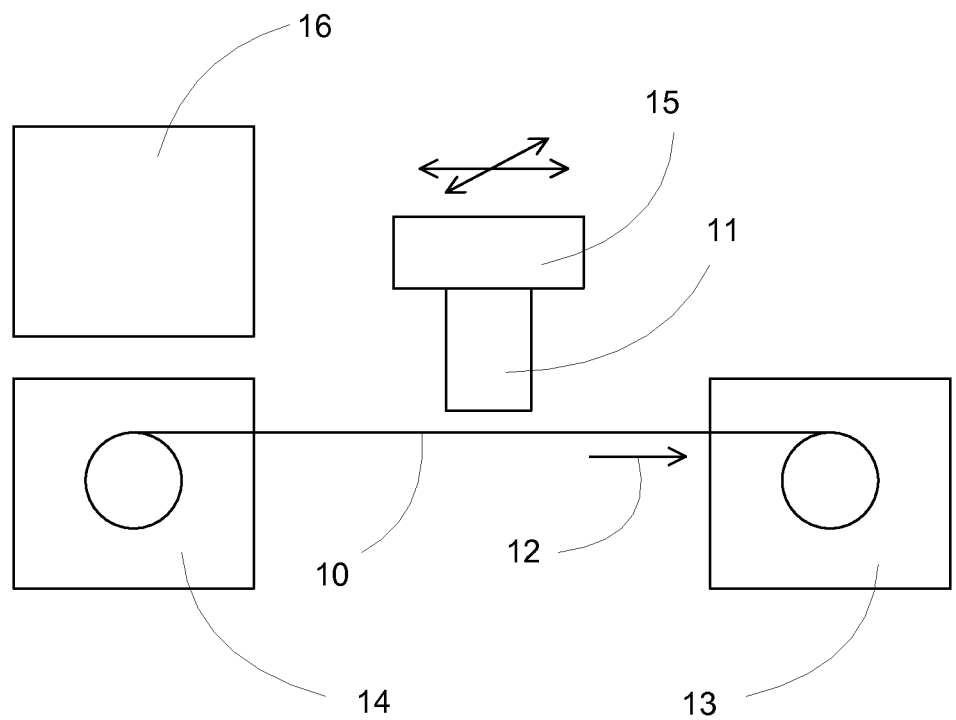
FIG. 1 illustrates an exemplary system comprising a roll-to-roll substrate and a printhead.

Embodiments of the present invention pertain to methods and apparatuses of transferring processed functional blocks from a donor substrate to an assembly substrate. In an embodiment, the functional blocks can be an integrated circuit such as a RFID circuit, fabricated from a silicon wafer, a plastic film, a glass sheet, or a multilayer film comprising these materials. The assembly substrate can be a plastic film or sheet with or without device components, for example, with the antenna fabricated thereon. The assembly substrate can be a printed circuit board, or any flexible or hard substrate. Interconnections can be included, for example, vias or interconnects to establish electrical connection between the functional blocks or from the functional blocks to the existing components (e.g. antenna for RFID functional blocks) in the assembly substrate.

In an embodiment, the present invention includes a printhead with a plurality of functional blocks arranged in a densely packed array and adhered to a donor substrate. The printhead can move repeatedly to appropriate locations of the assembly substrate, and at each location, at least one functional block is selected from the array and transferred to the assembly substrate. In an embodiment, the present invention allows for parallel processing of functional blocks, through delivering a plurality of functional blocks at one time, and/or through a plurality of printheads.

In an aspect, integrated circuit elements are formed in a densely packed array, for example in a processed wafer, and separated into individual functional blocks. The functional blocks can be transferred as a dense array to the print head, for example, to a printhead reservoir, before being distributed to the assembly substrate where the spacing and density are different than the spacing and density in the densely packed array.

In an aspect, the printhead can be used to place functional blocks such as integrated circuit elements in receptor sites in a substrate. For example, the functional blocks can be the control elements of a radio frequency identification tag, which are deposited to a substrate having the matching antenna fabricated thereon. Electrical connections can be performed to connect the functional blocks with the antenna. In an aspect, the density of the functional blocks on the substrate is quite sparse, since the functional elements can be less than 1 mm, while the antenna can be several centimeters.

In an embodiment, the present printhead delivery can be applied to different types of functional blocks. For example, a first printhead can deliver one type of functional block. Then a second printhead can deliver either more of the first type of functional block, or a second type of functional block. In an aspect, the functional blocks can be from a processed wafer, which can also be thinned and diced in wafer format, and temporarily held in place on a dicing tape or other adhesives. An entire section of the wafer can be transferred at once to the printhead.

In an embodiment, the present invention includes a system and method for forming electronic assemblies. An exemplary system includes a station that includes a printhead that includes arrays of functional blocks packed therein, and an alignment mechanism to align the printhead over the substrate over the proper locations. The system can comprise a substrate advancing mechanism such as a web line that supports a web substrate. The printhead can comprise a transfer mechanism configured to transfer the functional blocks to the substrate. For example, the transfer mechanism includes a heat source and a light source for releasing the functional blocks from the adhesion with the donor substrate. The printhead can be mounted on a motion control mechanism to move along and across the substrate, such as an X-Y alignment stage for holding the printhead.

In an embodiment, the present invention results in an electronic assembly in which a plurality of functional blocks is positioned on an assembly substrate. The functional blocks can be held by an adhesive film wherein the adhesive film is laminated to the assembly substrate. The substrate can be treated with an adhesive to hold the functional blocks, and in an aspect, the system further includes a treatment station that uses one of heat, chemicals, light, or radiation to activate the adhesive material on the substrate.

In an embodiment, the present invention pertains to a printer system which is used to print thin film objects, such as thin silicon integrated circuits, on a substrate. The thin film objects, or functional blocks, are stored in a printhead, preferably through a releasable adhesive such as the photoactivated thermal transfer elements such as are described in U.S. Pat. Nos. 6,946,178 and 7,141,348 by Sheats, et al., hereby incorporated by reference. The referenced patents disclose a method of transferring thin film devices from a donor substrate, on which the polymeric photoactivated thermal transfer material has been applied, on to a target substrate. In this process, irradiation with actinic light is used to selectively activate the polymer under a device which the user wishes to transfer, while leaving other devices on the same substrate inactivated. Heating the polymer causes it to vaporize and transfer the device to a target substrate in close proximity while leaving the inactivated devices on the donor substrate. By this method, such objects as very small integrated circuit functional blocks, with lateral dimensions of less than 100 microns, for example, which are difficult or impossible to handle effectively by other means such as the pick and place machines which are well known in the art, can be placed onto product substrate at very high speed. The invention is advantageously used for small and thin silicon functional blocks, but may also be used with any object which is thin enough to be readily adhered to a thin polymer film; for example light emitting diodes, thin film sensors, MEMS devices, thin film capacitors or resistors, and other electronic or optical components.

FIG. 1 illustrates an exemplary system comprising a roll-to-roll substrate 10 and a printhead 11. Alternatively, other types of substrates can be used. The system further comprises a substrate advancing mechanism, such as a motor in a station 13 to roll the roll-to-roll substrate in direction 12. The system also can comprise a substrate loading station 14 for preparing and loading the substrate. The printhead 11 is preferably mounted on a motion control stage 15 which moves the printhead in the directions across and/or along the substrate where the printhead can deliver the functional blocks onto the appropriate locations on the substrate. The system can comprise a printhead loading station 16 for loading, such as gluing, the functional blocks onto the printhead. The functional blocks are adhered to the printhead through a releasable adhesive that can be deactivated by heat, light, or other conventional methods.

The printhead may be located with respect to the substrate such that each proper location on the substrate is underneath a functional block on the printhead. To perform the transfer process, the releasable adhesive film is deactivated, for example, through heat and light sources, while the functional blocks are in contact with or proximity to the substrate. When the releasable adhesive is deactivated, the functional blocks are transferred to the substrate. Once the transfer process is completed, the printhead can move to another location, or the substrate can be advanced to a new location or a new substrate. Electrical contacts to one or more contact pads on the functional blocks can be made. The contacts might be a direct resistive electrical contact, or a capacitive or inductive electrical contact.

Figure 2:
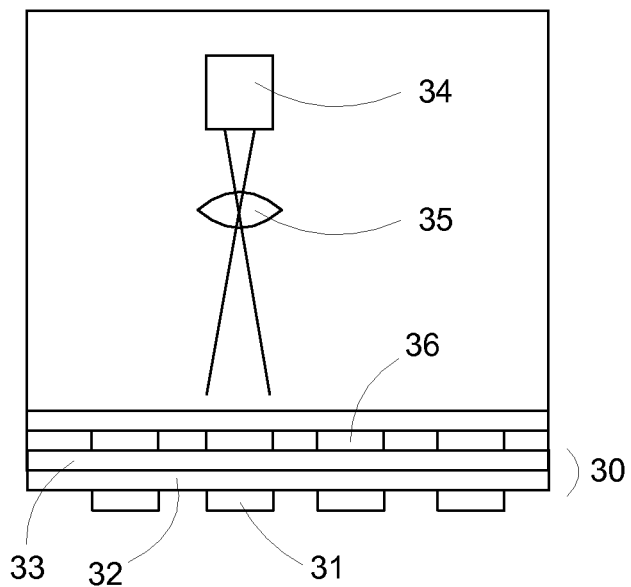
FIG. 2 illustrates an exemplary printhead.

FIG. 2 illustrates an exemplary printhead which comprises a reservoir 30 of functional blocks 31 for deliver onto the assembly substrate. In an embodiment, the functional blocks are adhered to a donor substrate 33 through a releasable adhesive 32. The printhead can be attached to precision motion control stages. The position of the stage is determined by feedback from machine vision systems, such as digital cameras, which observe alignment marks on both the printhead and the target substrate, and compute the required motion of the printhead to achieve alignment.

The printhead can comprise a releasing mechanism to release the functional blocks. In an embodiment, the releasing mechanism comprises a heat source and a light source, which act upon the releasable adhesive to deactivate the adhesive. The light source can include an optical exposure unit 34, such as for example a laser beam or other imageable optical source, together with an optical alignment system 35 provided for aligning the light source, so that the adhesive polymer under a specific functional block is irradiated.

Subsequently, or concurrently, in an embodiment, it is also necessary to provide heat to this area of the polymer. Thus the releasing mechanism can comprise a heat source, such as an array of heating elements 36 for heating the adhesive. In an embodiment, the deactivation of the releasable adhesive is similar to the operation as described in U.S. Pat. Nos. 6,946, 178 and 7,141,348 in which the entire donor substrate and associated polymer may be heated to the temperature which effects polymer decomposition, since only the irradiated polymer decomposes at this temperature, while the remaining polymer is affected only at a substantially higher temperature. Thus, in one embodiment of the invention, the entire substrate is heated to the desired temperature, and upon irradiation of a selected spot, the device adhered to that spot is immediately transferred.

In an embodiment, the functional blocks are transferred as a dense array to a reservoir on the printhead. The functional blocks can be fabricated on a substrate such as a wafer, in a semiconductor fabrication facility. In an aspect, the wafer can be thinned and diced. Thinning, by a combination of grinding (for example with a diamond grinding wheel) and polishing (with chemical mechanical polishing such as is used to make silicon wafers very flat) are used and are well known in the industry; wafers with thicknesses down to 20 or even 15 μm are routinely provided. Dicing may be done with a standard saw, but at the cost of requiring a wide kerf or street width (up to 100 μm) which wastes considerable space when the width of an entire functional block is 100 μm or less. Alternatives are the use of lasers, which can readily achieve widths of 20 μm, and deep plasma etching, which requires a photoresist but has even higher resolution. Before dicing, the wafer is adhered to an adhesive tape (usually called a blue tape) to prevent individual device separation.

When this preparation is finished, the functional blocks, separated from each other, are still adhered to the blue tape, positioned exactly as they were when they were attached to each other. There may be some inhomogeneous stresses in the tape which are released when the functional blocks are released from each other, resulting in a small degree of difference between the lateral spacing of the functional blocks. This difference is at most a small fraction of that distance, and hence is far less than 1 μm. Thus the lateral position of the functional blocks is very well known, and very uniform, at this point in the process. The vertical position is also well known and uniform, because they have not moved since the time at which they were part of a single, very flat wafer, and the thinning process has a thickness repeatability of approximately +/−3 μm.

In an embodiment, the functional blocks are loaded to the printhead at a printhead loading station. In an aspect, to load the printhead, the blue tape in its frame is placed on a fixture which holds the frame, and places a very small amount of tension on the tape. The tape will be stretched by this tension, up to an amount not exceeding a few percent. This is sufficient to ensure uniform and reproducible positioning of all of the functional blocks on the wafer in the vertical direction, and any nonuniformity in the lateral direction is still well under +/−10% of the functional block separation distance.

The coated printhead is then lowered onto the wafer until it is in soft contact (with a force which may be measured and controlled by force sensors), and the required input is made to the blue tape to cause release of the functional blocks from its adhesive, thereby transferring the functional blocks to the printhead. This set of operations (starting with receiving the thinned, diced wafer and ending with the functional blocks transferred to the printhead) can be automated and carried out at relatively high speed: a single machine can easily prepare a printhead in far less time than it takes to print the functional blocks on the printhead.

By way of illustration of the foregoing point, there are 10,000 functional blocks of 100×100 μm lateral size in a 1 cm2 area. In 10 cm there are 1,000,000. Thus, if the printing rate of a single printhead is between 1 and 10 per second, it will require a minimum of about 20 minutes and up to 30 hours to print all the functional blocks in one loading of a 1 $cm^2$ printhead, or longer for larger printheads.

The loaded printhead is then mounted on a fixture with precision motion stages and optical alignment systems as previously described. The fixture also contains an optical beam delivery unit, which optionally accepts a fiber optic cable and contains one or more lenses and possibly other optical components for forming a uniform irradiation beam whose lateral extent slightly exceeds the dimensions of the device to be printed. The light source, if it is a laser, may be used to supply multiple printheads by means of beamsplitters and fiber optic cables. In this way, a relatively inexpensive printhead may be constructed which allows a printer to have multiple printheads to process multiple components in sequence at a cost which is less than the cost of using separate machines for each component. The printer is analogous, in this respect, to an ink printer in which the separate units of a multicolor printer are placed in sequence, and their cost adds up to much less than the cost of the basic printer with its substrate handling and curing components. It also allows for a custom configurable printer, so that a single base unit can supply the needs of different users who want to place different numbers of types of components, and who may wish to manufacture different products with these varying configurations at different times.

In a typical application, the components, e.g. functional blocks, which have been so printed, require some kind of electrical connection to each other or to an additional element which may be already present on the target substrate, such as a printed antenna for a radio frequency identification (RFID) tag. Thus, positional accuracy is important. In the specific case of making RFID tags, it is desirable to have the functional block positioned with respect to the antenna ends to a precision of about +/−25 microns. Other applications may have other specifications. If it is desired to electrically connect one functional block to another, the precision will be determined in part by the size of the bonding pads. These are a fraction of the size of the functional block, which itself may be well under 100 microns, perhaps only 50 microns or 25 microns on each side. Thus there is a requirement to position the device to be transferred with the corresponding level of precision.

In an embodiment, the present printhead does not heat the entire donor substrate. The substrate may be large, and heating it all wastes energy. There will commonly be a very large number of small devices on one printhead, and it will take a relatively long time to print them all, even when each one is printed rapidly. This results in the polymer being held at high temperature for a long time, which may adversely affect its properties: even though it does not decompose and cause printing of a device, it may no longer work as well after prolonged heating.

Another reason for localization of the heating process is to afford better and more flexible process control. For example, it may be preferable in a given application to either apply the optical irradiation first and heat second, vice versa, or both simultaneously. If heat is applied after irradiation, it may be desirable to control the rate of rise of temperature in order to optimize the process. In this case it is desirable to have a localized heat source which can be turned on and off rapidly, and applied to a small area, preferably not much larger than the area which has been (or is to be) irradiated.

In an embodiment, the present invention discloses a method and apparatus for localized heating in a printhead. Thin film heating elements are provided in the donor substrate, which are addressed in a row and column fashion, similarly to the addressing of the elements of a digital display. Preferably, the elements have a lateral dimension which is an integer multiple of the lateral dimension of the functional block which is to be printed, including one half of the border width between functional blocks. The elements are composed of a transparent conductor, so that the polymer is accessible to optical irradiation. Suitable materials include the common transparent oxides indium tin oxide (ITO), aluminum doped zinc oxide (Al:ZnO), and other similar materials known in the art.

Figure 3:
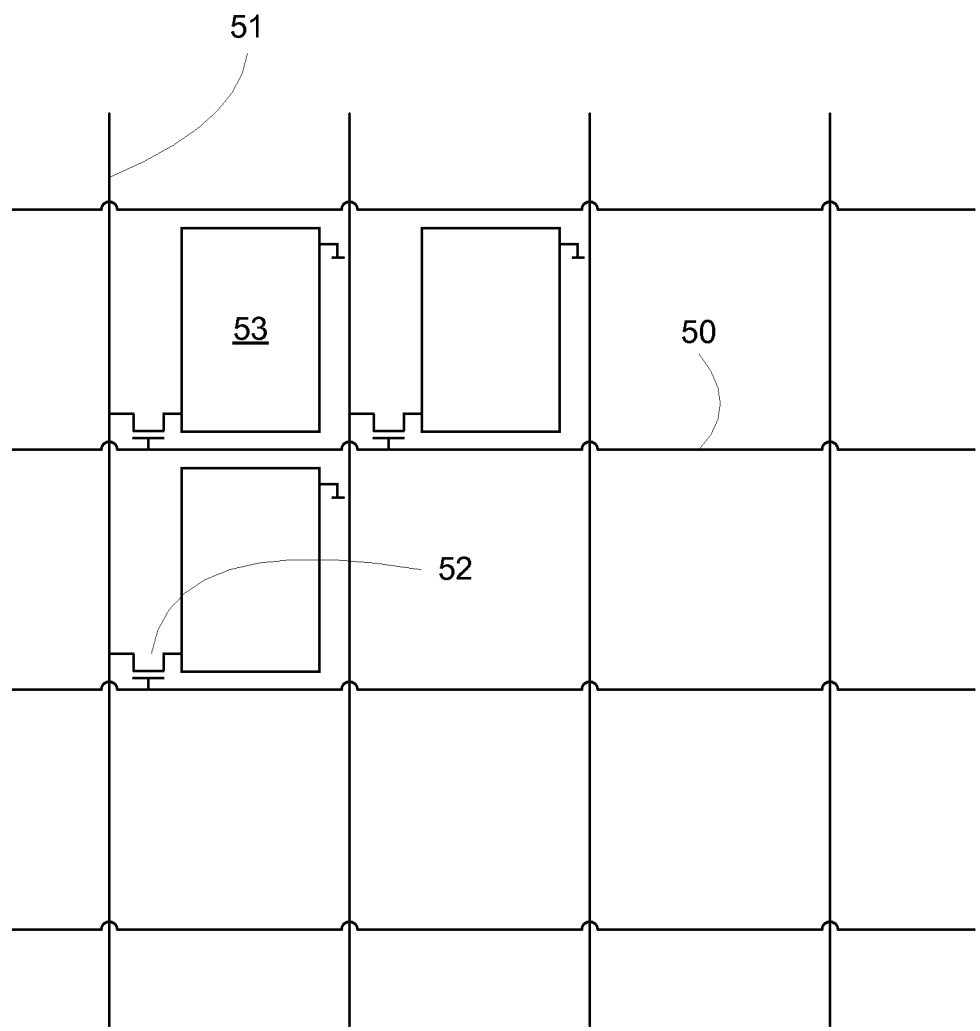
FIG. 3 illustrates an exemplary configuration of the thin film heating element array.

FIG. 3 illustrates an exemplary configuration of the thin film heating element array. Rows 50 and columns 51 form a mesh to provide power to the individual heating element. Control transistors 52 have the gate connected to row 50 and the source connected to column 51. Upon activating the right control transistor, power can be supplied to the heating elements 53 to heat the heating element 53 to the desired temperature. In an aspect, the heating element can be just the right size so that one heating element can heat one functional block. In other aspects, the heating element is large so that one heating element can cover a plurality of functional blocks. Alternatively, the heating element can be small so that one functional block spans across a plurality of heating elements, and thus several heating elements are needed to release one functional block.

In order to selectively address the heating elements, the row and column electrodes must be provided with switching elements. As with displays, these elements may be composed of transistors, for example thin film transistors. In order to turn an element on and heat it to the desired temperature, a voltage is applied to the transistor gate via the row electrode, and current flows through the column electrode to the source and thence to drain, to one edge of the heater element. The other edge is connected to a common ground line.

The transistors must be capable of supplying enough current to heat the element, which is considerably different from the electrical requirements of a display. Typically, the element should be capable of heating a thickness of dielectric material of approximately 10 microns thickness to the required temperature; this includes the thickness of the active heating element plus the thickness of the transfer polymer. The heat capacity of this set of materials can be approximated by that of fused silica, which is 703 J/kg K, and whose density is 2.2 g/cm3. Therefore 1.5 mJ of heat are required for each 1 mm square area, or 15 µJ for 100×100 microns.

In order to have the capability of inducing the thermal decomposition essentially instantaneously, that is, on a time scale which is controlled entirely by the chemical kinetics and not by the supply of heat, it is desirable that the heat be supplied in a period of as little as 1 msec., since very little chemical reaction will occur in a solid polymer in that period. Thus the power required is (per 1 mm2) 1.5 W. For typical thin film transistors, the voltage in the fully on state will be of the order of 10 V, and so the current required is 150 mA (per mm2), or 1.5 mA for the 100×100 micron square. It is to be understood that these are only exemplary values and that different values may be used in various applications of the invention.

A typical amorphous silicon thin film transistor, such as is used for display pixel switching, can supply a source-drain current of about 10 µA at 10 V, for a channel width of 50 µm and length of 1 µm. This is limited by the charge carrier mobility of amorphous silicon, and to get more current would require either a wider or narrower channel. Greater width than about 100 µm or a little less would not be possible within the constraints of the heated element width, and a shorter channel would require much more expensive lithography which is not commonly available in process lines for such transistor fabrication.

Polycrystalline silicon, made by thermal or laser-induced recrystallization of amorphous silicon, provides much higher mobilities (100× or higher), and so polycrystalline thin film transistors meet the requirements of the present invention. The process of laser-induced crystallization for making this material is well known in the art; it is disclosed, for example, in U.S. Pat. No. 5,994,174 by Carey, et al. Several mA of current can be passed through these transistors, which is sufficient to supply the needs of the heating elements in the present invention.

Another option for forming the transistors is to use thin films of single crystalline silicon formed on thin insulator layers on silicon wafers (SOI), as manufactured, for example, by Soitech. This process results in devices with mobilities, and hence maximum current capacities, several times higher than polysilicon.

It is a requirement of the printhead that it is transparent to optical irradiation, and deep UV wavelengths are in some cases desirable. Thus the heating elements should pass wavelengths down to about 248 nm with little or no absorption.

Using the values calculated for the example above, the resistance required for a power dissipation of 15 mW and 1.5 mA is about 7000Ω. A layer of ITO with a sheet resistance of 7000Ω presents negligible absorption even in the deep ultraviolet. However, the transistors will present some obstruction to the passage of light. Therefore, in the preferred embodiment, the transistors are located in spaces in between heating elements, and the size of the heating elements are made to be integer multiples of the size of the devices to be transferred. For most cases, the street width in between devices is typically not less than 10 µm, and often more, so there is adequate room for this configuration.

In order to construct a printhead, the thin film circuitry is first fabricated on the flat UV-transparent substrate. The resulting surface is not as flat due to the topography of the transistors and conductor lines. Thus, at the end a planarizing layer may be added, using for example spin casting, in order to have a very flat surface which is desirable for the printing process. Such a planarizing layer may be formed from sol-gel precursors, such as alkoxysilanes or similar materials which are converted to transparent dielectrics upon heating.

It may also be advantageous to assist the planarization by forming, by etching, wells at the locations of the transistors. The transistors may be entirely buried in the substrate, and connected to the heating elements by vias. The row and column wiring may be similarly recessed, so that only a very thin (e.g. less than a micron thick) layer of dielectric is interposed between the free surface of the printhead and the heater elements. This final layer may be further smoothed and flattened, if desired, by chemical mechanical polishing or other polishing processes. In this way the volume of material which has to be heated is minimized, the distance over which thermal energy has to diffuse to reach the polymer is minimized, and the printhead with its coating of photoactive thermally decomposable polymer can be easily adhered to the devices to be transferred using a minimal (or otherwise selectable) thickness of polymer.

The transistors may be fabricated by standard processes known in the art for thin film silicon transistors. Since the substrate is preferably a deep-UV transparent, thermally stable dielectric material which can be formed in a very flat plate (for example fused silica), the transistor fabrication process does not have be restricted to very low temperatures, and process conditions which are known in the industry can be used to obtain devices with optimal properties. The heating element, which is optionally composed of a transparent conducting oxide, may be formed either by vacuum deposition (for example sputtering or the like), or from solution processable precursors. For example, antimony tin oxide (ATO) is available in nanoparticulate form from Keeling and Walker, and can be cured to moderate conductivity at a few hundred degrees C. Other conducting oxides (for example ITO and Al:ZnO) are also available in particulate precursors, and can achieve conductivities useful in the present invention with curing at moderate temperatures.

In operation, this printhead need only be moved laterally a distance of a few device widths in between printing operations, since the heating is localized. If the entire substrate or photoactive thermally decomposable polymer film is heated, then the printhead has to be in place for printing before the irradiation begins, and must stay there until it ends. With this system, the printhead, after delivery of one device, moves just as far as an area where it is still cool; this might be directly adjacent, or it might be one or a few devices away, depending on the size of the heater elements relative to the size of the devices being printed. If the printhead has to skip devices in order to find a cool area, it is relatively simple to come back and pick up the missed devices later, as the distance is quite small; far less, for example, than the distance traveled on each cycle by a pick and place arm.

By constructing a flat, inexpensive printhead whose lateral size can be easily chosen in the range of centimeters (e.g., between 1 and 30 cm, preferably in the range of 3 to 10 cm), the transfer of devices for printing onto the printhead (which may be called a "pre-press" operation) is facilitated. If the devices are silicon functional blocks, for example, they are in many cases obtained in the form of a solid silicon wafer which has been processed into functional circuits. It may or may not have been already adhered to an adhesive-coated backing tape held in a stretched frame; this tape is often blue and called "blue tape" in the IC industry. Several companies sell tape suitable for this purpose; for example Nitto Denko and Lintec. The adhesive has the property that its stickiness can be reduced to a very low value by the application of either heat or UV light (according to the specific choice of material). This property is quite different from the property of the materials described in U.S. Pat. Nos. 6,946,178 and 7,141,348, which do not simply change their adhesive property but undergo a complete, clean and very rapid decomposition into vapor.

This printhead delivers a highly localized, well-controlled heat pulse with minimal waste of energy in a simple, long-lived solid state mechanism which requires no maintenance, as opposed to lamps or external heater elements which tend to wear out due to oxidation, corrosion or the thermal stress of high temperature operation.

What is claimed is:

1. A printhead for delivering functional blocks to a substrate, comprising:
   a reservoir for accepting a plurality of functional blocks, wherein the functional blocks are transferred as an array to a releasable adhesive, wherein the releasable adhesive is disposed on a surface of the reservoir;
   a light source for providing photon energy to the releasable adhesive holding the functional blocks;
   a heat source comprising an array of thin film heating elements for providing thermal energy to the releasable adhesive holding the functional blocks;
   wherein the thin film heating elements are disposed between the light source and the reservoir, and wherein the thin film heating elements comprise transparent heating elements for passing light from the light source to the functional blocks on the reservoir; and
   a controller for controlling the thin film heating elements of the heat source to provide localized heating to selective areas of the releasable adhesive,
   wherein the heat source and the light source enable releasing individual functional blocks from the reservoir for positioning on the substrate.

2. A printhead as in claim 1 wherein the reservoir has a donor substrate where the functional blocks are adhered by a releasable adhesive.

3. A printhead as in claim 2 wherein the releasable adhesive comprises a polymeric photo-activated thermal transfer material.

4. A printhead as in claim 1 wherein the light source comprises a laser beam.

5. A printhead as in claim 1 further comprising at least one of a mirror mechanism, a plurality of lenses, and optical cables for directing the light source.

6. A printhead as in claim 1 wherein the functional blocks comprise semiconductor devices.

7. A printhead as in claim 1 wherein the thin film heating elements comprise rows and columns of heating elements which are addressable by the controller.

8. A printhead as in claim 1 wherein the controller for thin film heating elements comprises thin film transistors.

9. A printhead for delivering functional blocks to a substrate, comprising:
   a reservoir for accepting a plurality of functional blocks, wherein the functional blocks are transferred to a releasable adhesive, wherein the releasable adhesive is disposed on a surface of the reservoir;
   a light source for providing photon energy to the releasable adhesive holding the functional blocks;
   a heat source comprising an array of thin film heating elements for providing thermal energy to the releasable adhesive holding the functional blocks;
   wherein the thin film heating elements are disposed between the light source and the reservoir, and wherein the thin film heating elements comprise transparent heating elements for passing light from the light source to the functional blocks on the reservoir;
   switching elements coupled to the thin film heating elements to selectively address the thin film heating elements, wherein the switching elements are disposed in street areas between the functional blocks; and
   a controller for controlling the switching elements to provide localized heating to selective areas of the releasable adhesive,
   wherein the heat source and the light source enable releasing individual functional blocks from the reservoir for positioning on the substrate.

10. A printhead as in claim 9 wherein the switching elements comprise thin film transistors.

11. A printhead as in claim 9 wherein the switching elements comprise transistors fabricated from thin film of single crystalline silicon.

12. A printhead for delivering functional blocks to a substrate, comprising:
- a reservoir for accepting a plurality of functional blocks, wherein the functional blocks are transferred to a releasable adhesive, wherein the releasable adhesive is disposed on a surface of the reservoir;
- a light source for providing photon energy to the releasable adhesive holding the functional blocks;
- a heat source comprising an array of thin film heating elements for providing thermal energy to the releasable adhesive holding the functional blocks;
- wherein the thin film heating elements are disposed between the light source and the reservoir, and wherein the thin film heating elements comprise transparent heating elements for passing light from the light source to the functional blocks on the reservoir;
- a planarizing layer disposed on the heat source for to provide a flat surface for coupling with the reservoir; and
- a controller for controlling the thin film heating elements of the heat source to provide localized heating to selective areas of the releasable adhesive,
- wherein the heat source and the light source enable releasing individual functional blocks from the reservoir for positioning on the substrate.

13. A printhead as in claim 12 further comprising
switching elements coupled to the thin film heating elements to selectively address the thin film heating elements, wherein the switching elements are disposed in street areas between the functional blocks.

14. A printhead as in claim 12 wherein the switching elements are entirely buried in a substrate and connected to the thin film heating elements by vias.

* * * * *